(12) United States Patent
Ichiki et al.

(10) Patent No.: US 12,051,571 B2
(45) Date of Patent: Jul. 30, 2024

(54) SUBSTRATE PROCESSING METHOD AND SUBSTRATE PROCESSING SYSTEM

(71) Applicant: Tokyo Electron Limited, Tokyo (JP)

(72) Inventors: Kazuya Ichiki, Nirasaki (JP); Tatsuya Yamaguchi, Nirasaki (JP); Syuji Nozawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 246 days.

(21) Appl. No.: 17/508,094

(22) Filed: Oct. 22, 2021

(65) Prior Publication Data

US 2022/0139682 A1    May 5, 2022

(30) Foreign Application Priority Data

Oct. 29, 2020 (JP) .................................. 2020-181796

(51) Int. Cl.
| | | |
|---|---|---|
| *C23C 16/04* | (2006.01) | |
| *B05D 1/00* | (2006.01) | |
| *C23C 16/56* | (2006.01) | |
| *H01J 37/32* | (2006.01) | |
| *H01L 21/02* | (2006.01) | |
| *H01L 21/311* | (2006.01) | |
| *H01L 21/67* | (2006.01) | |

(Continued)

(52) U.S. Cl.
CPC .......... *H01J 37/32724* (2013.01); *B05D 1/60* (2013.01); *C23C 16/045* (2013.01); *C23C 16/56* (2013.01); *H01J 37/32449* (2013.01); *H01J 37/32467* (2013.01); *H01L 21/0209* (2013.01); *H01L 21/31127* (2013.01); *H01J 2237/332* (2013.01); *H01L 21/02118* (2013.01); *H01L 21/67109* (2013.01); *H01L 21/7682* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 2008/0194111 A1* | 8/2008 | Delgadino | .......... H01L 21/0209 |
| | | | 257/E21.483 |
| 2012/0244677 A1* | 9/2012 | Lin | ..................... B81C 1/00269 |
| | | | 438/455 |

(Continued)

FOREIGN PATENT DOCUMENTS

| | | |
|---|---|---|
| JP | 2019-207909 A | 12/2019 |
| JP | 2020150087 A | 9/2020 |
| JP | 2020155716 A | 9/2020 |

*Primary Examiner* — Jose I Hernandez-Kenney
(74) *Attorney, Agent, or Firm* — Nath, Goldberg & Meyer; Jerald L. Meyer; Tanya E. Harkins

(57) ABSTRACT

A substrate processing method includes: a heating process of heating a substrate, which is placed on a stage disposed in a container and has a recess formed on one surface of the substrate, to a first temperature; a depositing process of depositing a thermally decomposable organic material on a front surface of the substrate by supplying a material gas into the container; and a removing process of removing the organic material deposited on a periphery of the recess and a back surface of the substrate, which is opposite to the one surface of the substrate, by holding the substrate at a position spaced apart from the stage and heating the substrate to a second temperature higher than the first temperature.

9 Claims, 17 Drawing Sheets

(51) Int. Cl.
 *H01L 21/768* (2006.01)
 *H01L 29/06* (2006.01)

(56) References Cited

U.S. PATENT DOCUMENTS

2015/0255316 A1\* 9/2015 Dobashi ............ H01L 21/67051
 15/316.1
2020/0020523 A1\* 1/2020 Kikuchi .............. H01L 21/3081
2020/0395244 A1\* 12/2020 Lee ..................... H01L 21/7682

\* cited by examiner

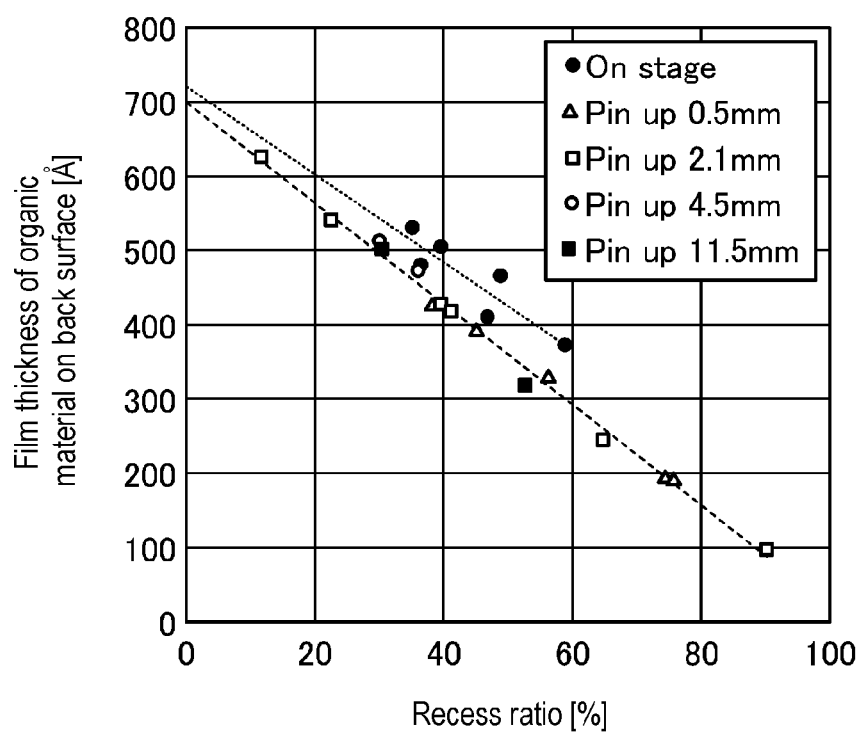

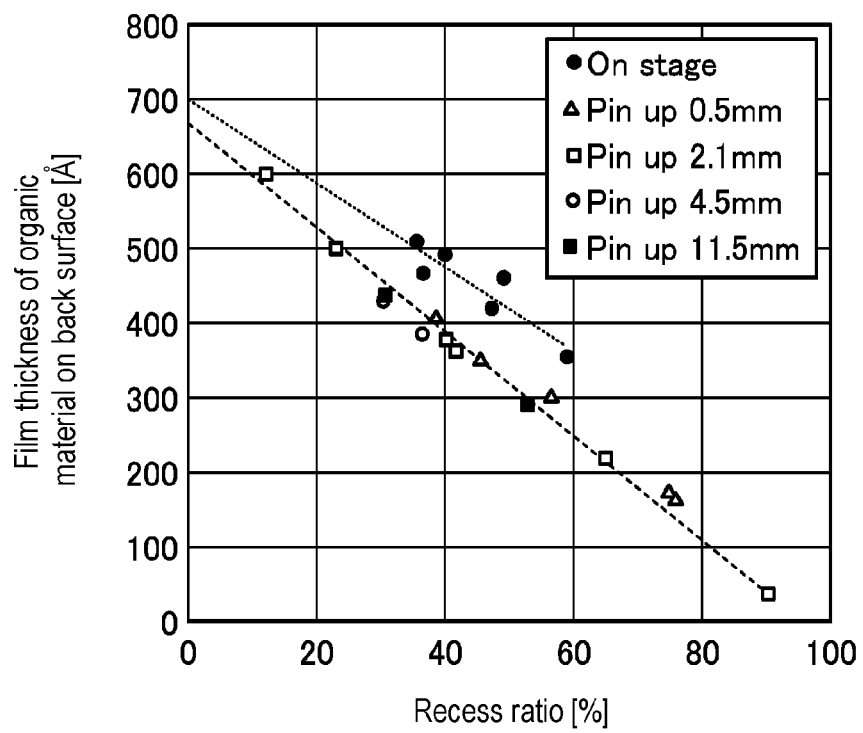

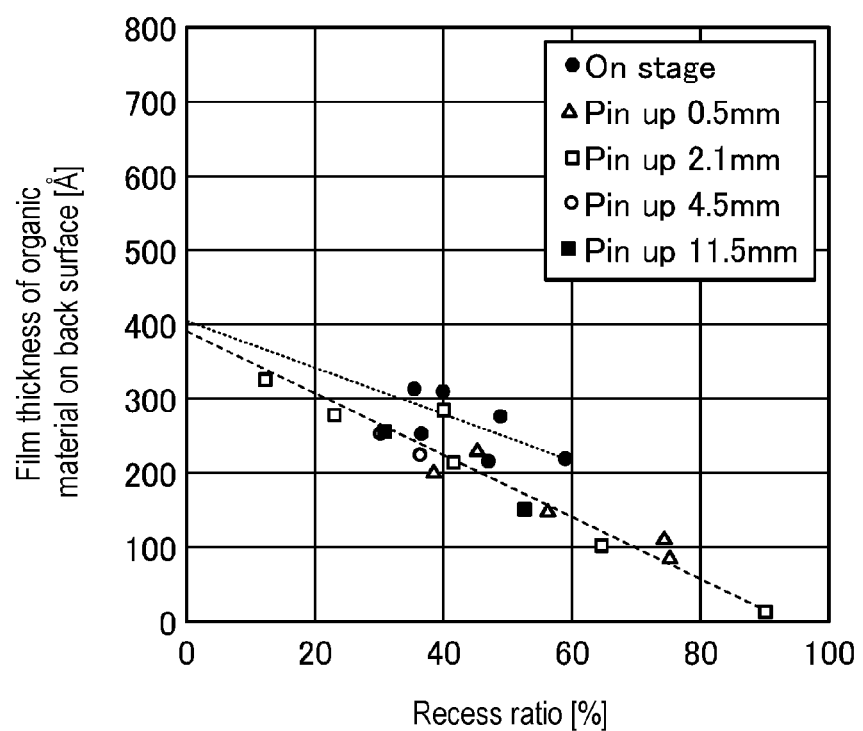

FIG. 14

|  | On stage | | Pin up = 2.1mm | |
|---|---|---|---|---|
| Recess time | 20 sec | 40 sec | 180 sec | 300 sec |
| Recess ratio | 29% | 60% | 27% | 69% |
| Film thickness uniformity | 7.9% | 5.9% | 2.8% | 1.4% |

SUBSTRATE PROCESSING METHOD AND SUBSTRATE PROCESSING SYSTEM

CROSS-REFERENCE TO RELATED APPLICATION

This application is based upon and claims the benefit of priority from Japanese Patent Application No. 2020-181796, filed on Oct. 29, 2020, the entire contents of which are incorporated herein by reference.

TECHNICAL FIELD

Various aspects and embodiments of the present disclosure relate to a substrate processing method and a substrate processing system.

BACKGROUND

For example, Patent Document 1 discloses a technique in which a polymer having a urea bond is embedded in a void formed in a substrate, an oxide film is formed on the substrate, and then the polymer is depolymerized. The depolymerized polymer is desorbed through the oxide film to form a void in a lower layer of the oxide film.

PRIOR ART DOCUMENT

Patent Document

Patent Document 1: Japanese Laid-Open Patent Publication No. 2019-207909

SUMMARY

A substrate processing method according to an aspect of the present disclosure includes a heating process, a depositing process, and a removing process. In the heating process, a substrate, which is placed on a stage disposed in a container and has a recess formed on one surface of the substrate, is heated to a first temperature. In the depositing process, a thermally decomposable organic material is deposited on a front surface of the substrate by supplying a material gas into the container. In the removing process, the organic material deposited on a periphery of the recess and a back surface of the substrate, which is opposite to the one surface of the substrate, is removed by holding the substrate at a position spaced apart from the stage and heating the substrate to a second temperature higher than the first temperature.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 12A is a diagram showing an example of a relationship between a film thickness of the organic material adhering to the back surface of the substrate and a recess ratio of the organic material deposited on a front surface of the substrate.

FIG. 12B is a diagram showing an example of a relationship between a film thickness of the organic material adhering to the back surface of the substrate and a recess ratio of the organic material deposited on the front surface of the substrate.

FIG. 12C is a diagram showing an example of a relationship between a film thickness of the organic material adhering to the back surface of the substrate and a recess ratio of the organic material deposited on the front surface of the substrate.

FIG. 14 is a diagram showing an example of uniformity in film thickness of the organic material on the front surface of the substrate after performing a recess process.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing method and a substrate processing system disclosed herein will be described in detail with reference to the drawings. The substrate processing method and the substrate processing system disclosed herein are not limited by the following embodiments.

When a material gas for depositing an organic material such as a polymer or the like is supplied into a container that accommodates a substrate, the organic material is deposited on a front surface of the substrate disposed on a stage, i.e., on a surface of the substrate opposite to a side of the stage. However, since a part of the material gas also enters a gap between the stage and the substrate, a film of the organic material may be deposited on a back surface of the substrate, i.e., a surface of the substrate on the side of the stage.

When the film of the organic material is deposited on the back surface of the substrate, the film adhering to the back surface of the substrate may be peeled off to generate particles during transfer of the substrate. Even when the film adhering to the back surface of the substrate is not peeled off, when the substrate is placed on a stage in another apparatus in a subsequent process, it may be difficult to hold the substrate on the stage in a stable manner due to influence of the film adhering to the back surface of the substrate. In addition, when the substrate is tilted on the stage due to the influence of the film adhering to the back surface of the substrate, a temperature distribution in the substrate may be biased.

Therefore, the present disclosure provides a technique capable of efficiently removing the organic material adhering to the back surface of the substrate.

[Configuration of Substrate Processing System 10]

Figure 1:
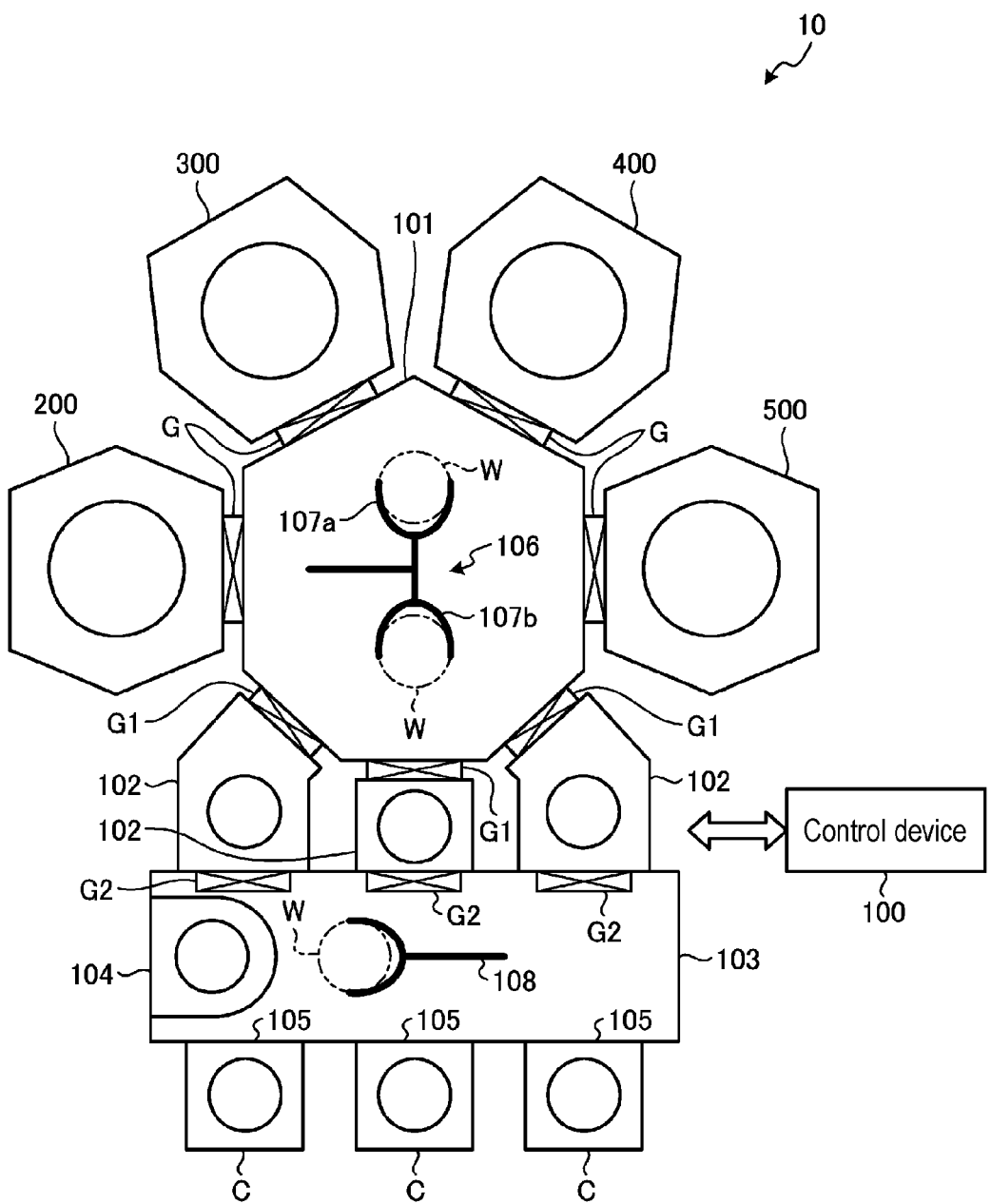
FIG. 1 is a system configuration diagram showing an example of a substrate processing system according to one embodiment of the present disclosure.

FIG. 1 is a system configuration diagram showing an example of a substrate processing system 10 according to one embodiment of the present disclosure. The substrate processing system 10 includes a film forming apparatus 200, a recess apparatus 300, a plasma processing apparatus 400, and a heating apparatus 500. The substrate processing system 10 is a multi-chamber type vacuum processing system. The substrate processing system 10 uses the film forming apparatus 200, the recess apparatus 300, the plasma processing apparatus 400, and the heating apparatus 500 to form an air gap in a substrate W on which elements used in a semiconductor device are formed. The film forming apparatus 200 is an example of a first processing apparatus, and the recess apparatus 300 is an example of a second processing apparatus.

The film forming apparatus 200 deposits a film of a thermally decomposable organic material on a front surface of the substrate W on which a recess is formed. In the present embodiment, the thermally decomposable organic material is a polymer having a urea bond, which is generated by polymerization of a plurality of types of monomers. The recess apparatus 300 performs a process of removing the organic material around the recess and reducing a thickness of the organic material deposited in the recess to a predetermined thickness by heating the substrate W on which the film of the organic material is deposited by the film forming apparatus 200. In the recess process, the film of the organic material deposited on an edge portion of the substrate W and a back surface of the substrate W is also removed. The back surface of the substrate W refers to a surface of the substrate W on a side of a stage on which the substrate W is placed.

The plasma processing apparatus 400 deposits a sealing film on the organic material deposited in the recess of the substrate W. The heating apparatus 500 thermally decomposes the organic material below the sealing film and desorbs the organic material through the sealing film by heating the substrate W on which the sealing film is deposited by the plasma processing apparatus 400. As a result, an air gap is formed between the recess of the substrate W and the sealing film.

The film forming apparatus 200, the recess apparatus 300, the plasma processing apparatus 400, and the heating apparatus 500 are connected to four side walls of a vacuum transfer chamber 101 having a heptagonal plan-view shape via gate valves G, respectively. Three load lock chambers 102 are connected to the other three side walls of the vacuum transfer chamber 101 via gate valves G1. Each of the three load lock chambers 102 is connected to an atmospheric transfer chamber 103 via a gate valve G2.

The inside of the vacuum transfer chamber 101 is evacuated by a vacuum pump and maintained at a predetermined degree of vacuum. A transfer device 106 such as a robot arm or the like is provided in the vacuum transfer chamber 101. The transfer device 106 transfers the substrate W among the film forming apparatus 200, the recess apparatus 300, the plasma processing apparatus 400, the heating apparatus 500, and the respective load lock chambers 102. The transfer device 106 has two arms 107a and 107b that can move independently.

A plurality of ports 105 for mounting a carrier (front-opening unified pod (FOUP) or the like) C that accommodates substrates W are provided on a side surface of the atmospheric transfer chamber 103. Further, an alignment chamber 104 for aligning a substrate W is provided on a side wall of the atmospheric transfer chamber 103. A downflow of clean air is formed in the atmospheric transfer chamber 103.

A transfer device 108 such as a robot arm or the like is provided in the atmospheric transfer chamber 103. The transfer device 108 transfers the substrate W among each carrier C, each load lock chamber 102, and the alignment chamber 104.

A control device 100 includes a memory, a processor, and an input/output interface. The memory stores a program executed by the processor, a receipt including conditions for each process, and the like. The processor executes the program read from the memory and controls individual components of the substrate processing system 10 via the input/output interface based on the recipe stored in the memory.

[Film Forming Apparatus 200]

Figure 2:
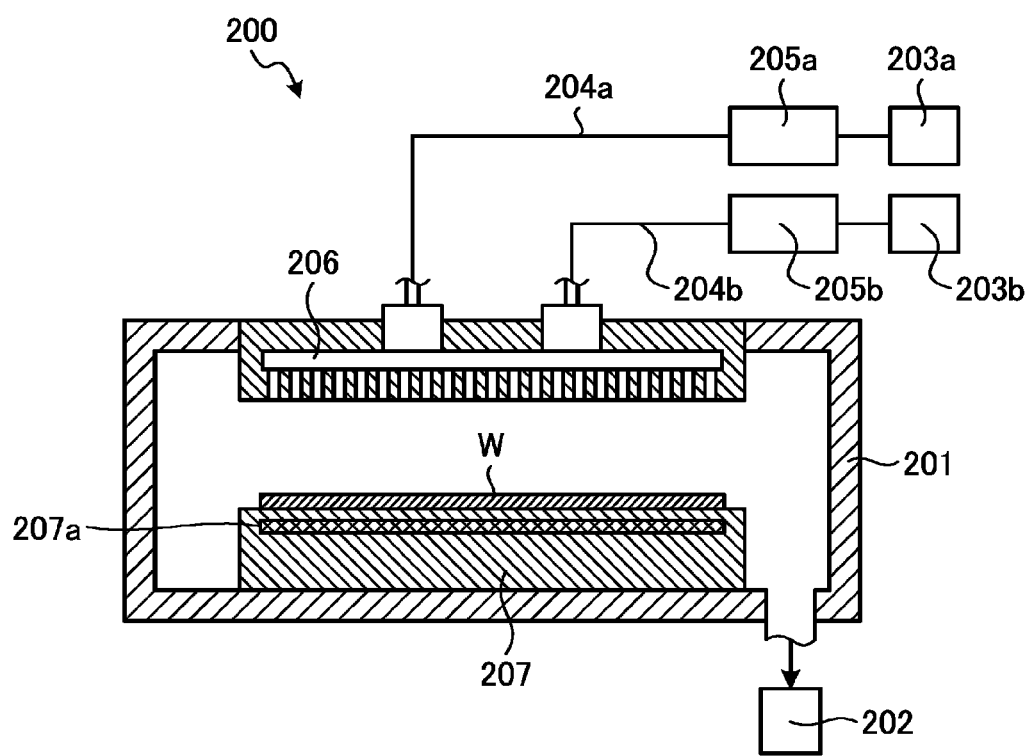
FIG. 2 is a schematic diagram showing an example of a film forming apparatus according to one embodiment of the present disclosure.

FIG. 2 is a schematic sectional view showing an example of the film forming apparatus 200 according to one embodiment of the present disclosure. The film forming apparatus 200 includes a container 201, an exhaust device 202, a shower head 206, and a stage 207. In the present embodiment, the film forming apparatus 200 is, for example, a chemical vapor deposition (CVD) apparatus. The container 201 is an example of a first container, and the stage 207 is an example of a first stage.

A shower head 206 is provided on an upper portion of the container 201. The shower head 206 is an example of a gas supply. A plurality of types of raw material monomers is supplied to the container 201 via the shower head 206. The raw material monomers are, for example, isocyanates and amines A raw material source 203a for storing isocyanates as a liquid is connected to the shower head 206 via a pipe 204a. Further, a raw material source 203b for storing amines as a liquid is connected to the shower head 206 via a pipe 204b.

The isocyanate liquid supplied from the raw material source 203a is vaporized by a vaporizer 205a installed in the pipe 204a. Vapor of isocyanate vaporized by the vaporizer 205a is introduced into the shower head 206 via the pipe 204a. Further, the amine liquid supplied from the raw material source 203b is vaporized by a vaporizer 205b installed in a pipe 204b. Vapor of amine vaporized by the vaporizer 205b is introduced into the shower head 206. The vaporized isocyanate vapor and the vaporized amine vapor are examples of material gases.

Many discharge holes are formed on a lower surface of the shower head 206. The shower head 206 discharges the isocyanate vapor introduced via the pipe 204a and the amine vapor introduced via the pipe 204b from separate discharge holes into the container 201 in a shower shape.

The exhaust device 202 exhausts a gas in the container 201. The interior of the container 201 is controlled by the exhaust device 202 to a vacuum atmosphere of a predetermined pressure. The exhaust device 202 is controlled by the control device 100.

Inside the container 201, there is provided a stage 207 on which a substrate W having a recess formed on one surface thereof is placed. A back surface of the substrate W opposite to the one side on which the recess is formed is supported by the stage. The stage 207 is provided with a heater 207a for adjusting a temperature of the substrate W. The heater 207a is an example of a temperature adjuster and a first temperature adjuster. By controlling the heater 207a, the control device 100 controls the temperature of the substrate W so that an upper surface of the substrate W has a first temperature suitable for vapor deposition polymerization of raw material monomers. The first temperature may be determined according to the type of the raw material monomers, and may be, for example, 40 degrees C. to 200 degrees C.

By causing a vapor deposition polymerization reaction of two kinds of raw material monomers on the front surface of the substrate W using such a film forming apparatus 200, the organic material is deposited on the front surface of the substrate W on which the recess is formed. When the two types of raw material monomers are isocyanates and amines, a film of a polymer of polyurea is deposited on the front surface of the substrate W. The polyurea polymer is an example of a thermally decomposable organic material.

A part of the vaporized isocyanate vapor and the vaporized amine vapor also enters a gap between the substrate W and the stage 207. As a result, the organic material adheres to an edge portion of the substrate W and the back surface of the substrate W, i.e., the surface of the substrate W on a side of the stage 207.

[Recess Apparatus 300]

Figure 3:
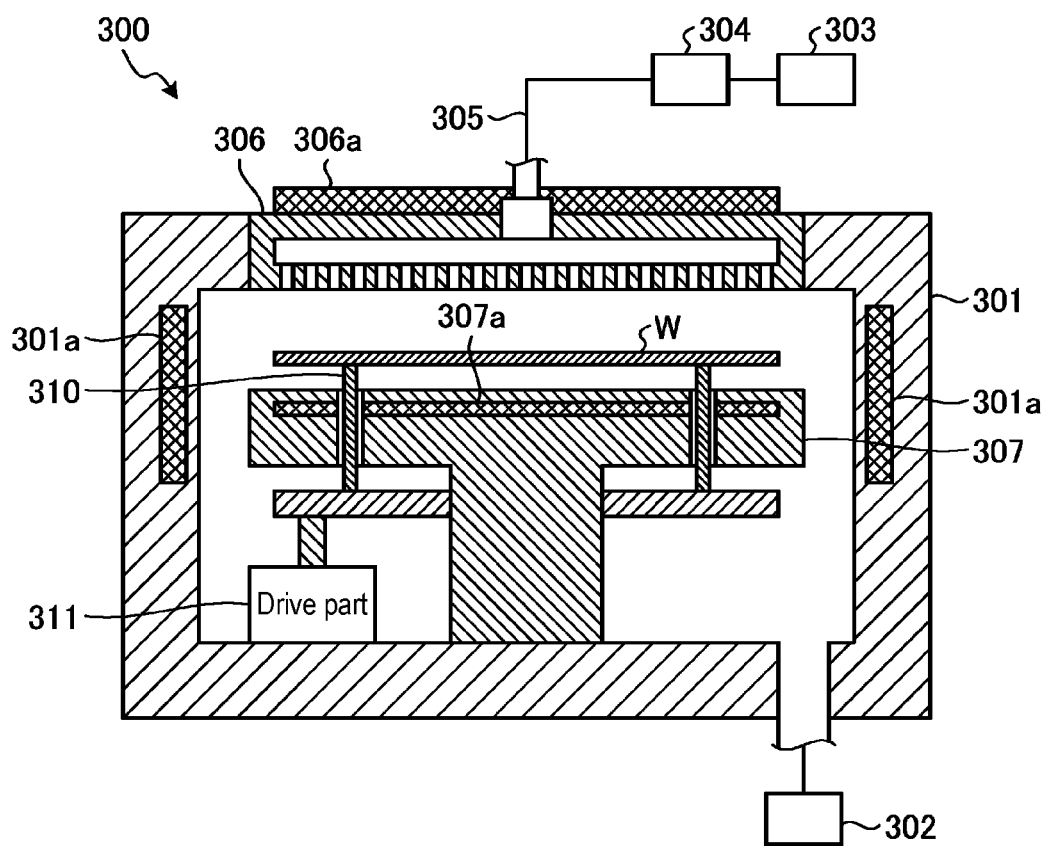
FIG. 3 is a schematic diagram showing an example of a recess apparatus according to one embodiment of the present disclosure.

FIG. 3 is a schematic sectional view showing an example of the recess apparatus 300 according to one embodiment of the present disclosure. The recess apparatus 300 includes a container 301, an exhaust device 302, a shower head 306, and a stage 307. The container 301 is an example of a second container, and the stage 307 is an example of a second stage.

The shower head 306 is provided on an upper portion of the container 301. An inert gas such as nitrogen gas or a rare gas is supplied to the container 301 via the shower head 306. A flow rate controller 304 and a gas source 303 are connected to the shower head 306 via a pipe 305. A flow rate of the inert gas supplied from the gas source 303 is controlled to a predetermined flow rate by the flow rate controller 304, and the inert gas is introduced into the shower head 306 via the pipe 305. The flow rate controller 304 is controlled by the control device 100.

Many discharge holes are formed on a lower surface of the shower head 306. The shower head 306 discharges the inert gas introduced via the pipe 305 from the discharge holes into the container 301 in a shower shape.

The exhaust device 302 exhausts a gas in the container 301. The interior of the container 301 is controlled by the exhaust device 302 to a vacuum atmosphere of a predetermined pressure. The exhaust device 302 is controlled by the control device 100.

The stage 307 is provided in the container 301. The stage 307 is provided with a plurality of (for example, three) lift pins 310 that penetrate the stage 307. The lift pins 310 can be moved vertically by a drive part 311. When the substrate W on which the film of the organic material is deposited by the film forming apparatus 200 is loaded into the container 301, the drive part 311 moves the lift pins 310 upward and receives the substrate W at tip ends of the lift pins 310. By moving the lift pins 310 in the vertical direction, the drive part 311 adjusts a position of the substrate W so that a distance between the stage 307 and the substrate W becomes a predetermined distance. The drive part 311 is controlled by the control device 100. The lift pins 310 are an example of a holder.

A heater 306a is provided in the shower head 306, a heater 301a is provided on a side wall of the container 301, and a heater 307a is provided in the stage 307. The heater 307a is an example of a temperature adjuster and a second temperature adjuster. The control device 100 controls the heater 301a, the heater 306a, and the heater 307a in a state in which the distance between the stage 307 and the substrate W is maintained at the predetermined distance by the lift pins 310. Then, the control device 100 controls a temperature of the substrate W so that an upper surface of the substrate W has a second temperature at which depolymerization of the raw material monomers occurs. The second temperature may be determined according to the type of the raw material monomers, and may be, for example, 240 degrees C. to 400 degrees C.

As a result, the film of the organic material around the recess of the substrate W is removed, and the organic material in the recess to a depth corresponding to the temperature of the substrate W and a heating time thereof is depolymerized and desorbed from the recess. Further, the film of the organic material adhering to the edge portion of the substrate W and the back surface of the substrate W is also depolymerized and removed.

Even when the substrate W is heated to the second temperature in a state in which the substrate W is placed on the stage 307, depolymerization occurs in the organic material adhering to the edge portion of the substrate W and the back surface of the substrate W. However, in the state in which the substrate W is placed on the stage 307, conductance in a space in a vicinity of the edge portion of the substrate W and a space between the back surface of the substrate W and the stage 307 is low. Therefore, the depolymerized and desorbed monomers may stay in the space in the vicinity of the edge portion of the substrate W and the space between the back surface of the substrate W and the stage 307, and may form a polymer again on the edge portion of the substrate W and the back surface of the substrate W. Therefore, in the state in which the substrate W is placed on the stage 307, it is difficult to remove the organic material adhering to the edge portion of the substrate W and the back surface of the substrate W.

It is also possible to remove the organic material adhering to the edge portion of the substrate W and the back surface of the substrate W by continuously heating the substrate W to the second temperature until the organic material adhering to the edge portion of the substrate W and the back surface of the substrate W is removed. However, in this case, the organic material deposited in the recess on the upper surface of the substrate W is also removed. This makes it difficult to form an air gap in the substrate W.

Therefore, in the present embodiment, the substrate W is heated to the second temperature in a state in which the distance between the stage 307 and the substrate W is maintained at the predetermined distance. In this case, the conductance of the space between the substrate W and the stage 307 is increased, and the monomers depolymerized and desorbed from the film of the organic material on the back surface of the substrate W are easily moved from the space between the substrate W and the stage 307. Thus, the monomers depolymerized and desorbed from the film of the organic material on the back surface of the substrate W are less likely to re-adhere to the back surface of the substrate W. As a result, it is possible to remove the organic material film adhering to the edge portion of the substrate W and the back surface of the substrate W while leaving the organic material film in the recess of the substrate W.

[Plasma Processing Apparatus 400]

Figure 4:
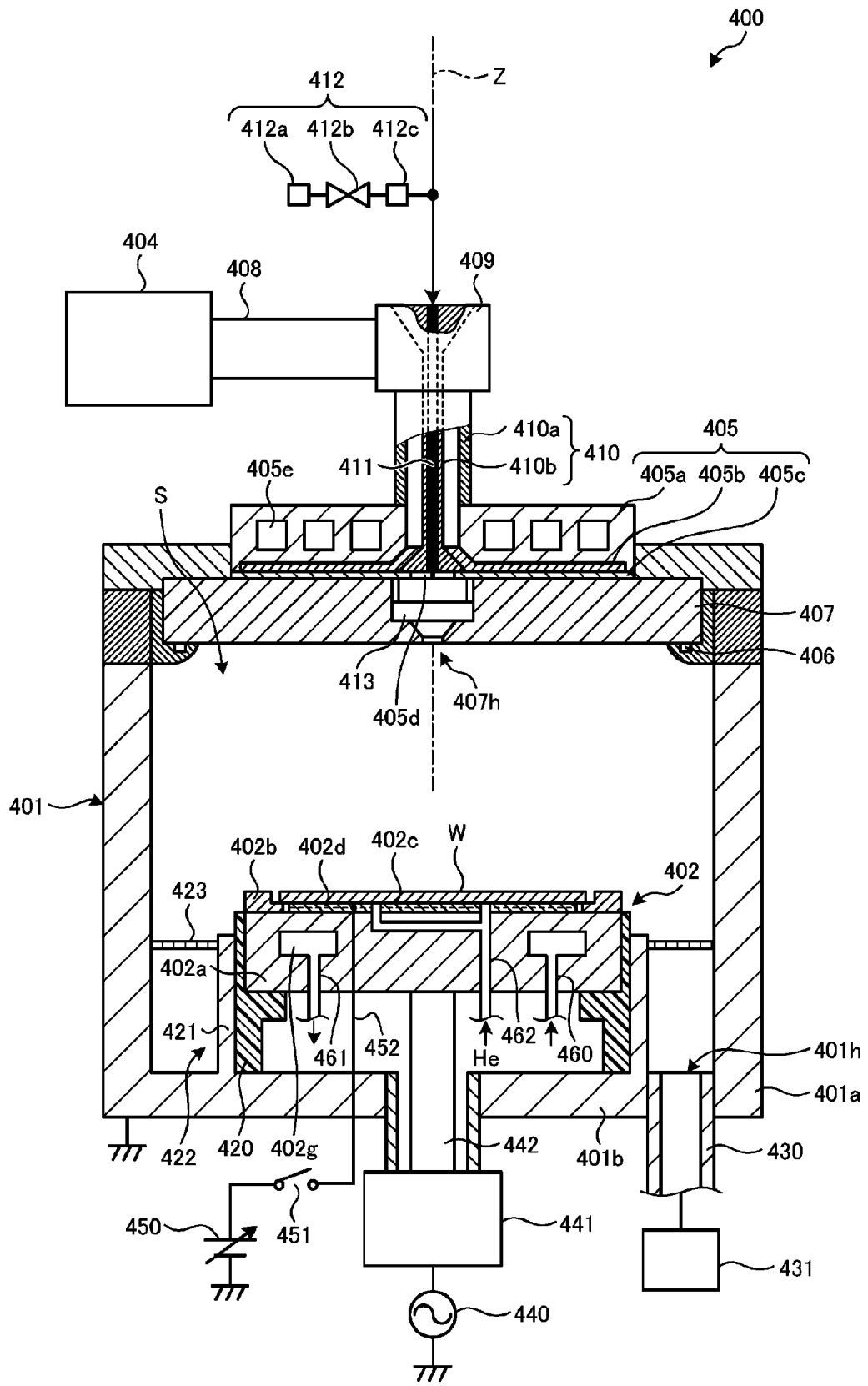
FIG. 4 is a schematic diagram showing an example of a plasma processing apparatus according to one embodiment of the present disclosure.

FIG. 4 is a schematic view showing an example of the plasma processing apparatus 400 according to one embodiment of the present disclosure. The plasma processing apparatus 400 includes a container 401 and a microwave output device 404.

For example, the container 401 is formed in a substantially cylindrical shape by aluminum having an anodized surface, and is configured to provide a substantially cylindrical processing space S therein. The container 301 is grounded for security. The container 401 also has a side wall 401a and a bottom 401b. A central axis of the side wall 401a is defined as an axis Z. The bottom 401b is provided on a side of a lower end of the side wall 401a. The bottom 401b is provided with an exhaust port 401h for gas exhaust. In addition, an upper end portion of the side wall 401a is opened.

A dielectric window 407 is provided at an upper end portion of the side wall 401a, and an opening at the upper end portion of the side wall 401a is closed by the dielectric window 407. A lower surface of the dielectric window 407 faces the processing space S. An O-ring 406 is disposed between the dielectric window 407 and the upper end portion of the side wall 401a.

A stage 402 is provided in the container 401. The stage 402 is provided to face the dielectric window 407 in a direction of the axis Z. A space between the stage 402 and the dielectric window 407 is the processing space S. The substrate W is placed on the stage 402.

The stage 402 has a base 402a and an electrostatic chuck 402c. The base 402a is formed in a substantially disk shape by a conductive material such as aluminum or the like. The base 402a is disposed in the container 401 so that a central axis of the base 402a substantially coincides with the axis Z.

The base 402a is formed of a conductive material and is supported by a tubular support 420 extending along the axis Z. A conductive tubular support 421 is provided on an outer periphery of the tubular support 420. The tubular support 421 extends from the bottom 401b of the container 401 toward the dielectric window 407 along an outer circumference of the tubular support 420. An annular exhaust passage 422 is formed between the tubular support 421 and the side wall 401a.

An annular baffle plate 423 having a plurality of through-holes formed in a thickness direction thereof is provided on an upper portion of the exhaust passage 422. The exhaust port 401h described above is provided below the baffle plate 423. An exhaust device 431 including a vacuum pump such as a turbo molecular pump or the like, an automatic pressure control valve, and the like is connected to the exhaust port 401h via an exhaust pipe 430. The exhaust device 431 can depressurize the processing space S to a predetermined degree of vacuum.

The base 402a also functions as a radio frequency (RF) electrode. An RF power source 440 that outputs an RF signal for RF bias is electrically connected to the base 402a via a feeding rod 442 and a matching unit 441. The RF power source 440 supplies a bias power of a predetermined frequency (e.g., 13.56 MHz), which is suitable for controlling energy of ions drawn into the substrate W, to the base 402a via the matching unit 441 and the feeding rod 442.

The matching unit 441 accommodates a matcher for matching an impedance on a side of the RF power source 440 and an impedance on a side of the load such as an electrode, plasma, or the container 401. A blocking capacitor for self-bias generation is included in the matcher.

An electrostatic chuck 402c is provided on an upper surface of the base 402a. The electrostatic chuck 402c attracts and holds the substrate W by an electrostatic force. The electrostatic chuck 402c has a substantially disk-like outer shape. A heater 402d is embedded in the electrostatic chuck 402c. A heater power source 450 is electrically connected to the heater 402d via a wiring 452 and a switch 451. The heater 402d heats the substrate W placed on the electrostatic chuck 402c by electric power supplied from the heater power source 450. An edge ring 402b is provided on the base 402a. The edge ring 402b is disposed to surround the substrate W and the electrostatic chuck 402c. The edge ring 402b is sometimes called a focus ring.

A flow path 402g is formed inside the base 402a. A coolant is supplied to the flow path 402g from a chiller unit (not shown) via a pipe 460. The coolant supplied into the flow path 402g is returned to the chiller unit via a pipe 461. A temperature of the base 402a is controlled by allowing the coolant having a temperature controlled by the chiller unit to circulate through the flow path 402g of the base 402a. The temperature of the substrate W on the electrostatic chuck 402c is controlled by the coolant flowing through the base 402a and the heater 402d disposed in the electrostatic chuck 402c. In the present embodiment, the temperature of the substrate W is controlled to, for example, 20 degrees C. to 270 degrees C. (e.g., 150 degrees C.).

Further, the stage 402 is provided with a pipe 462 for supplying a heat transfer gas such as He gas or the like to a gap between the electrostatic chuck 402c and the substrate W.

The microwave output device 404 outputs microwaves for exciting a processing gas supplied into the container 401. The microwave output device 404 generates microwaves having a frequency of, for example, 2.4 GHz.

The microwave output device 404 is connected to a mode converter 409 via a waveguide 408. The mode converter 409 converts a mode of the microwaves output from the microwave output device 404 and supplies the mode-converted microwaves to an antenna 405 via a coaxial waveguide 410.

The coaxial waveguide 410 includes an outer conductor 410a and an inner conductor 410b. The outer conductor 410a and the inner conductor 410b have a substantially cylindrical shape, and are disposed above the antenna 405 so that central axes of the outer conductor 410a and the inner conductor 410b substantially coincide with the axis Z.

The antenna 405 includes a cooling jacket 405a, a dielectric plate 405b, and a slot plate 405c. The slot plate 405c is formed in a substantially disk-like shape by a conductive metal. The slot plate 405c is provided on an upper surface of the dielectric window 407 so that a central axis of the slot plate 405c coincides with the axis Z. A plurality of slot holes is formed in the slot plate 405c. The slot holes are disposed in pairs around the central axis of the slot plate 405c.

The dielectric plate 405b is formed in a substantially disk-like shape by a dielectric material such as quartz or the like. The dielectric plate 405b is disposed on the slot plate 405c so that a central axis of the dielectric plate 405b substantially coincides with the axis Z. The cooling jacket 405a is provided on the dielectric plate 405b.

A surface of the cooling jacket 405a is formed of a conductive material, and a flow path 405e is formed inside the cooling jacket 405a. A coolant is supplied into the flow path 405e from a chiller unit (not shown). A lower end of the outer conductor 410a is electrically connected to the upper surface of the cooling jacket 405a. Further, a lower end of the inner conductor 410b is electrically connected to the slot plate 405c via openings formed in central portions of the cooling jacket 405a and the dielectric plate 405b.

The microwaves propagating via the coaxial waveguide 410 propagate in the dielectric plate 405b and propagate to the dielectric window 407 from the slot holes formed in the slot plate 405c. The microwaves propagating to the dielectric window 407 are radiated into the processing space S from the lower surface of the dielectric window 407.

A gas pipe 411 is provided inside the inner conductor 410b of the coaxial waveguide 410. A through-hole 405d through which the gas pipe 411 can pass is formed in the central portion of the slot plate 405c. The gas pipe 411 extends through the inside of the inner conductor 410b and is connected to a gas supply 412.

The gas supply 412 supplies a processing gas for depositing a sealing film on the substrate W to the gas pipe 411. The gas supply 412 includes a gas source 412a, a valve 412b, and a flow rate controller 412c. The gas source 412a is a source of the processing gas for forming the sealing film. The processing gas includes a nitrogen-containing gas, a silicon-containing gas, and a rare gas. In the present embodiment, the nitrogen-containing gas is, for example, $NH_3$ gas or $N_2$ gas, the silicon-containing gas is, for example, $SiH_4$ gas, and the rare gas is, for example, He gas or Ar gas.

The valve 412b controls supply and stop of the processing gas from the gas source 412a. The flow rate controller 412c is, for example, a mass flow controller or the like, and controls a flow rate of the processing gas supplied from the gas source 412a.

An injector 413 is provided in the dielectric window 407. The injector 413 injects the processing gas, which has been supplied via the gas pipe 411, into the processing space S via a through-hole 407h formed in the dielectric window 407. The processing gas injected into the processing space S is excited by the microwaves radiated into the processing space S via the dielectric window 407. As a result, the processing gas is turned into plasma in the processing space S, and the sealing film is deposited on the substrate W by ions and radicals contained in the plasma. In the present embodiment, the sealing film is, for example, a silicon nitride film.

[Configuration of Heating Apparatus 500]

Figure 5:
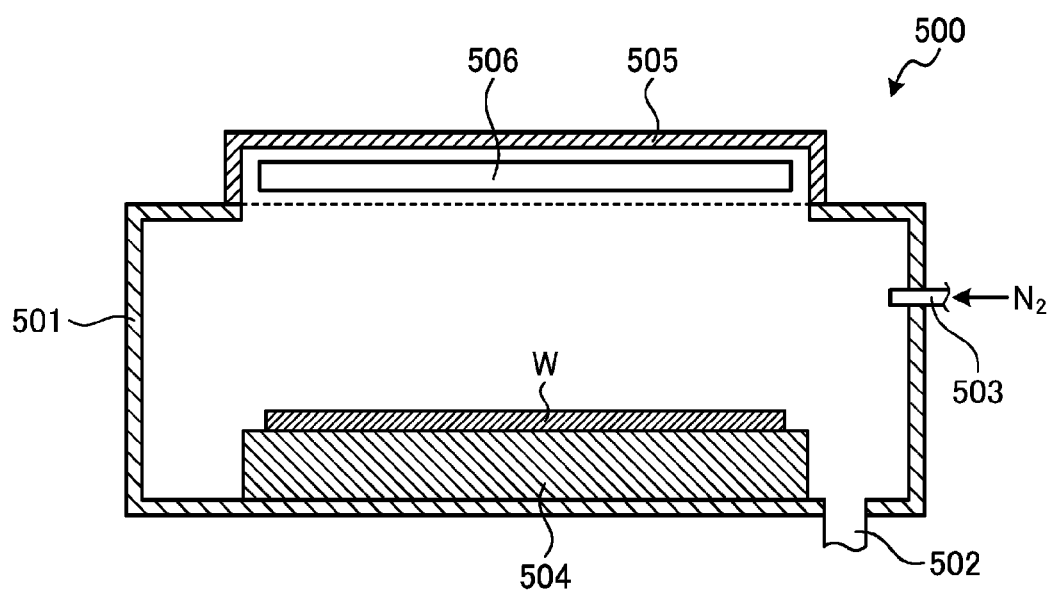
FIG. 5 is a schematic diagram showing an example of a heating apparatus according to one embodiment of the present disclosure.

FIG. 5 is a schematic diagram showing an example of the heating apparatus 500 according to one embodiment of the present disclosure. The heating apparatus 500 includes a container 501, an exhaust pipe 502, a supply pipe 503, a stage 504, a lamp house 505, and an infrared lamp 506.

The stage 504 on which the substrate W is placed is provided inside the container 501. The lamp house 505 is provided at a position facing a surface of the stage 504 on which the substrate W is placed. The infrared lamp 506 is disposed inside the lamp house 505.

An inert gas is supplied into the container 501 via the supply pipe 503. In the present embodiment, the inert gas is, for example, $N_2$ gas.

In a state in which the substrate W is placed on the stage 504, the inert gas is supplied into the container 501 via the supply pipe 503. Then, by turning the infrared lamp 506 on, the substrate W having the organic material deposited in the recess is heated. When a temperature of the organic material deposited in the recess of the substrate W reaches a predetermined temperature, the organic material is depolymerized into two kinds of raw material monomers. In the present embodiment, the organic material is polyurea. Therefore, when the substrate W is heated to 300 degrees C. or higher (e.g., 500 degrees C.), the organic material is depolymerized into isocyanates and amines, which are raw material monomers. Then, the depolymerized raw material monomers are desorbed from the recess via the sealing film.

[Method of Forming Air Gap]

Figure 6:
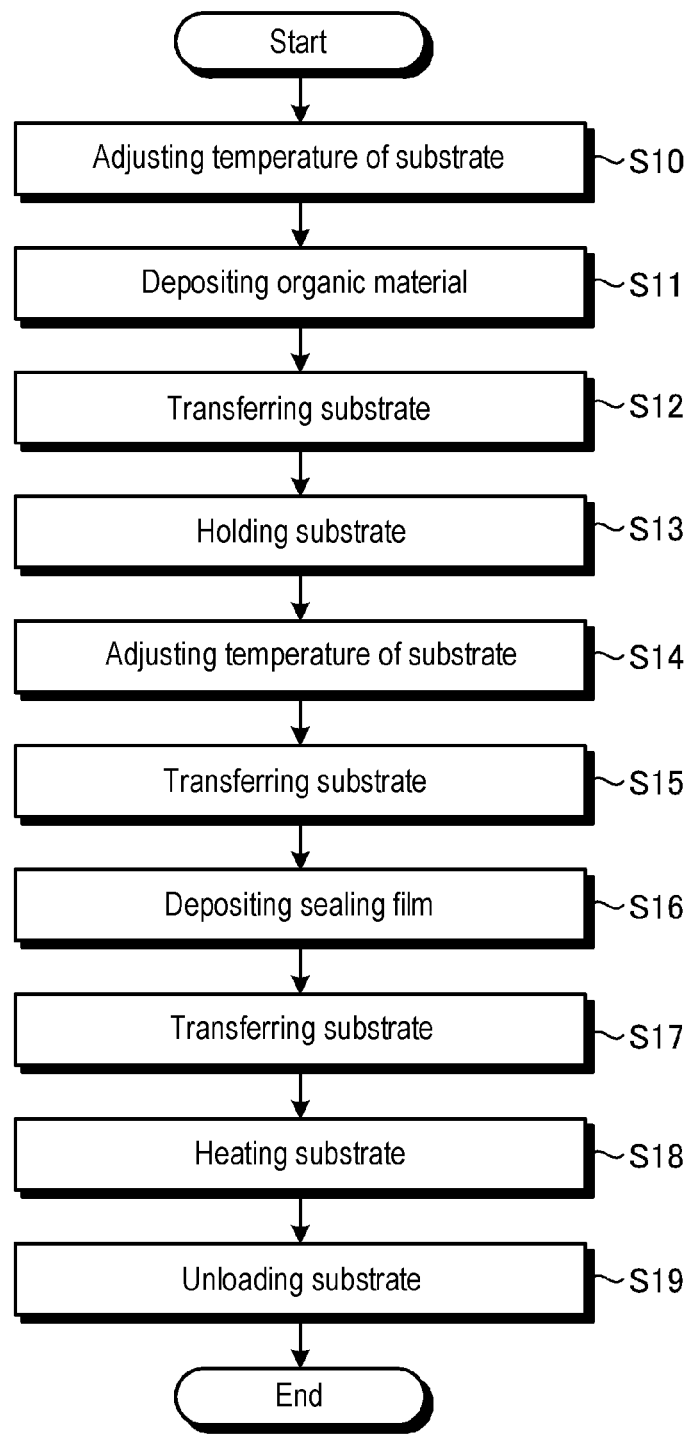
FIG. 6 is a flowchart showing an example of a substrate processing method according to one embodiment of the present disclosure.

FIG. 6 is a flowchart showing an example of a substrate processing method. For example, when the substrate W on which the recess is formed is loaded into the film forming apparatus 200 by the transfer device 106, the process illustrated in FIG. 6 is started. The process illustrated in FIG. 6 is realized by the control device 100 controlling individual components of the substrate processing system 10.

First, the temperature of the substrate W is adjusted to a first temperature in the film forming apparatus 200 (step S10). In step S10, the heater 207a in the stage 207 controls the substrate W mounted on the stage 207 to have the first temperature. Step S10 is an example of a heating process.

Figure 7:
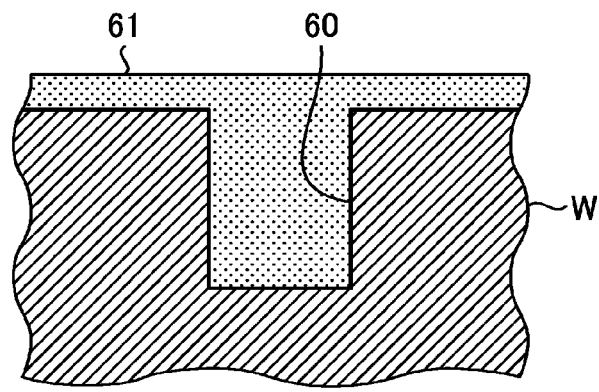
FIG. 7 is a schematic diagram showing an example of a semiconductor device manufacturing process.

Subsequently, an organic material is deposited on the substrate W (step S11). In step S11, a material gas (vapor of two types of monomers) is supplied into the container 201. Thus, as shown in FIG. 7, for example, an organic material 61 is deposited in a recess 60 of the substrate W. Step S11 is an example of a depositing process.

Subsequently, the substrate W is unloaded from the film forming apparatus 200 and transferred into the recess apparatus 300 by the transfer device 106 (step S12). In step S12, when the substrate W is transferred into the recess apparatus 300, the drive part 311 moves the lift pins 310 upward, whereby the substrate W is received by the tip ends of the lift pins 310. Step S12 is an example of a transfer process.

Subsequently, the substrate W is held at a predetermined position in the recess apparatus 300 (step S13). In step S13, the drive part 311 moves the lift pins 310 in the vertical direction, whereby the substrate W is held at a position where a distance between the stage 307 and the substrate W is a predetermined distance.

Figure 8:
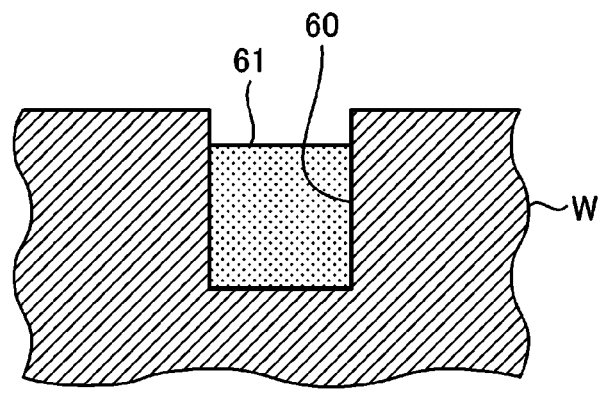
FIG. 8 is a schematic diagram showing an example of a semiconductor device manufacturing process.

Subsequently, in the recess apparatus 300, the temperature of the substrate W is adjusted to a second temperature (S14). In step S14, the substrate W is controlled to have the second temperature by the heater 301a, the heater 306a, and the heater 307a. As a result, for example, as shown in FIG. 8, the film of the organic material around the recess of the substrate W is removed, and the organic material in the recess to a depth corresponding to the temperature of the substrate W and the heating time of the substrate W is depolymerized and desorbed from the recess. Further, the film of the organic material adhering to the edge portion of the substrate W and the back surface of the substrate W is also depolymerized and removed. Steps S13 and S14 are examples of a removing process.

Subsequently, the substrate W is unloaded from the recess apparatus 300 and transferred into the plasma processing apparatus 400 by the transfer device 106 (step S15).

Figure 9:
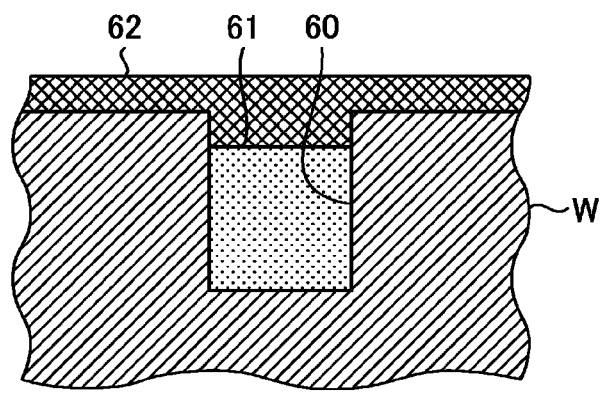
FIG. 9 is a schematic diagram showing an example of a semiconductor device manufacturing process.

Subsequently, a sealing film is deposited on the substrate W by the plasma processing apparatus 400 (step S16). Thus, for example, as shown in FIG. 9, a sealing film 62 is deposited on the organic material 61 in the recess 60 of the substrate W.

Subsequently, the substrate W is unloaded from the plasma processing apparatus 400 and is transferred into the heating apparatus 500 by the transfer device 106 (step S17).

Figure 10:
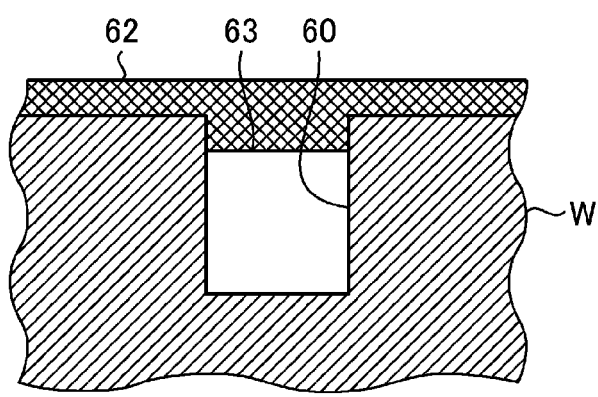
FIG. 10 is a schematic diagram showing an example of a semiconductor device manufacturing process.

Subsequently, the substrate W is heated by the heating apparatus 500 (step S18). In step S18, the substrate W is heated to a temperature of, for example, 300 degrees C. or higher (e.g., 500 degrees C.) by the heating apparatus 500, whereby the organic material 61 below the sealing film 62 is thermally decomposed and desorbed via the sealing film 62. Thus, for example, as shown in FIG. 10, in the recess 60, an air gap 63 corresponding to to shape of the organic material 61 is formed below the lower layer of the sealing film 62.

Subsequently, the substrate W is unloaded from the heating apparatus 500 by the transfer device 106 (step S19), whereby the process shown in this flowchart is completed.

[Film Thickness of Organic Material on Back Surface of Substrate W]

Figure 11:
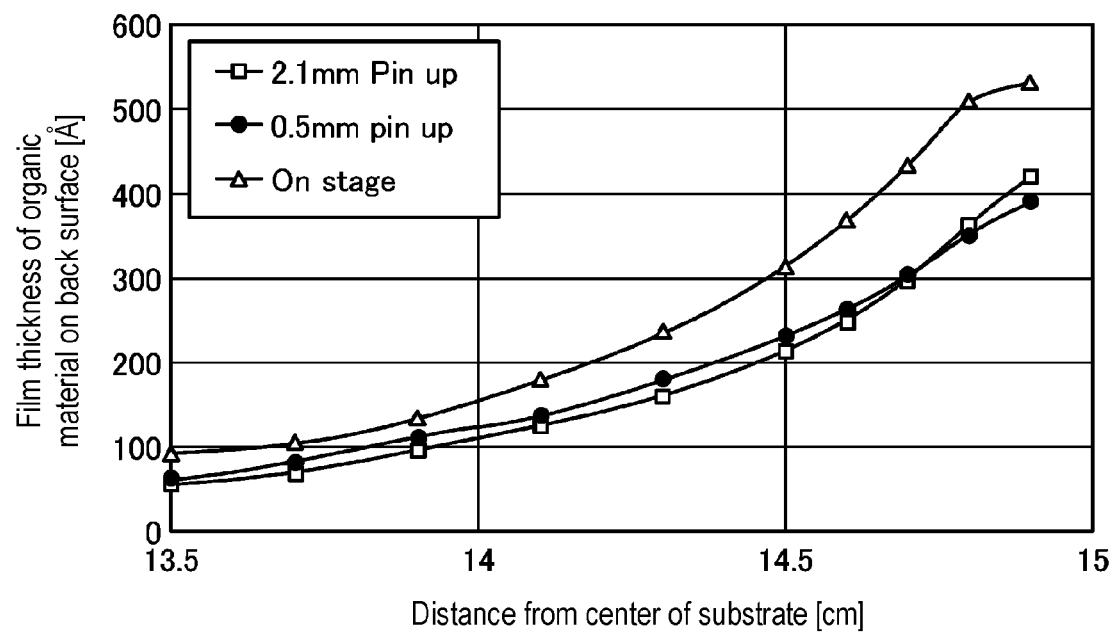
FIG. 11 is a diagram showing an example of a film thickness distribution of an organic material adhering to a back surface of a substrate.

FIG. 11 is a diagram showing an example of a distribution of a film thickness of the organic material adhering to the back surface of the substrate W. In FIG. 11, there is shown the distribution of the film thickness of the organic material on the back surface of the substrate W when the film thickness of the organic material on the front surface of the substrate W is reduced to about 40% by a recess process after the organic material having a film thickness of 1000 angstrom is deposited on the front surface of the substrate W (the surface of the substrate W opposite to the surface on the side of the stage 307). In FIG. 11, "2.1 mm Pin up" indicates that a distance between the substrate W and the stage 307 is 2.1 mm "On stage" indicates that the substrate W and the stage 307 are in contact with each other, i.e., that the distance between the substrate W and the stage 307 is 0 mm Referring to FIG. 11, the film thicknesses of the organic material on the back surface of the substrate W in both cases where the distance between the substrate W and the stage 307 are 0.5 mm and 2.1 mm, respectively, are smaller than the film thickness of the organic material on the back surface of the substrate W when the substrate W and the stage 307 are in contact with each other.

FIGS. 12A to 12C are diagrams showing examples of a relationship between a film thickness of the organic material adhering to the back surface of the substrate W and a recess ratio of the organic material deposited on the front surface of the substrate W. FIG. 12A shows a film thickness of the organic material on the back surface of the substrate W at a position spaced apart by 1 mm from the edge of the substrate W. FIG. 12B shows a film thickness of the organic material on the back surface of the substrate W at a position spaced apart by 2 mm from the edge of the substrate W. FIG. 12C shows a film thickness of the organic material on the back surface of the substrate W at a position spaced apart by 5 mm from the edge of the substrate W. The horizontal axis in FIGS. 12A to 12C indicates a rate at which the film thickness of the organic material on the front surface of the substrate W is reduced by the recess process after the organic material having a film thickness of 1000 angstrom is deposited on the front surface of the substrate W. For example, a 100% recess rate indicates that the organic material on the front surface of the substrate W has completely disappeared. Referring to FIGS. 12A to 12C, the film thicknesses (broken line) of the organic material when the distance between the substrate W and the stage 307 is 0.5 mm to 11.5 mm are smaller than the film thickness (dotted line) of the organic material when the substrate W and the stage 307 are in contact with each other.

When the substrate W and the stage 307 are separated from each other, a conductance of the space between the substrate W and the stage 307 is higher than that when the substrate W and the stage 307 are in contact with each other. Therefore, the monomers depolymerized and desorbed from the film of the organic material on the back surface of the substrate W are easily movable from the space between the substrate W and the stage 307, and are less likely to re-adhere to the back surface of the substrate W. This also applies to the edge portion of the substrate W. Therefore, by performing the recess process while keeping the substrate W spaced apart from the stage 307, it is possible to efficiently remove the organic material adhering to the edge portion of the substrate W and the back surface of the substrate W.

Referring to FIG. 11, in the cases where the distance between the substrate W and the stage 307 are 0.5 mm and 2.1 mm, respectively, the film thicknesses of the organic material on the back surface of the substrate W are substantially the same. In addition, referring to FIGS. 12A to 12C, in the cases where the distance between the substrate W and the stage 307 are 0.5 mm to 11.5 mm, respectively, the film thicknesses of the organic material on the back surface of the substrate W are substantially the same. Therefore, it is desirable that the recess process is performed in a state in which the substrate W and the stage 307 are spaced apart by at least 0.5 mm or more.

Figure 13:
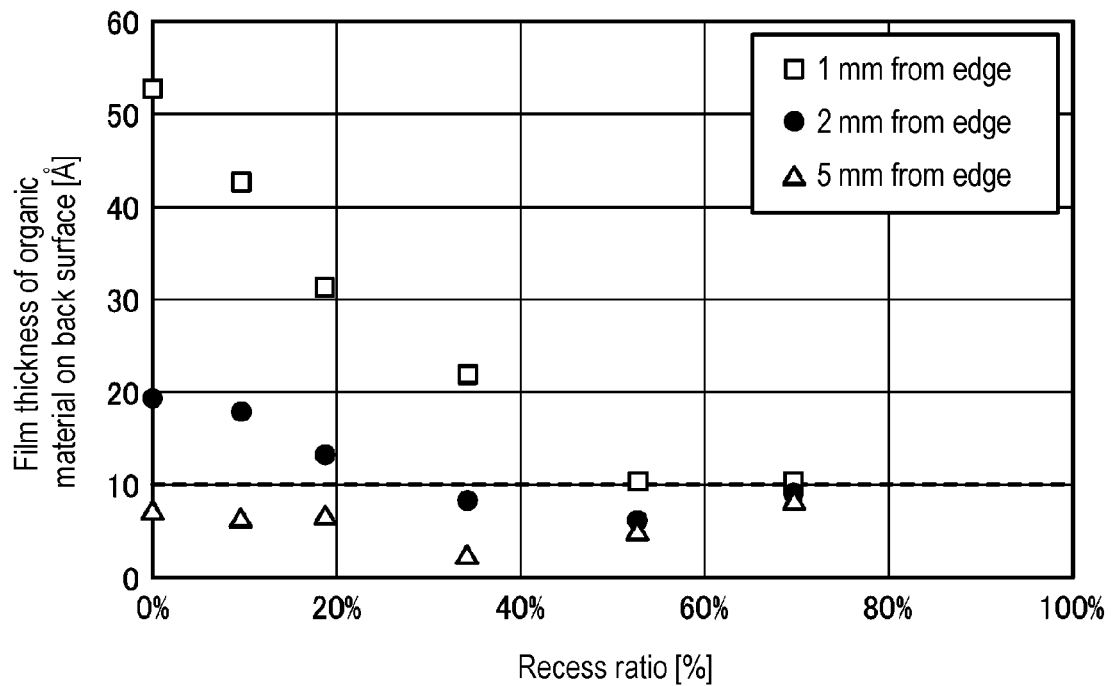
FIG. 13 is a diagram showing an example of a relationship between a film thickness of the organic material adhering to the back surface of the substrate and a recess ratio of the organic material deposited on the front surface of the substrate when a distance between the substrate and a stage is 2.1 mm.

FIG. 13 is a diagram showing an example of a relationship between the film thickness of the organic material adhering to the back surface of the substrate W and the recess ratio of the organic material deposited on the front surface of the substrate W when the distance between the substrate W and the stage 307 is 2.1 mm. The horizontal axis in FIG. 13 indicates a rate at which the film thickness of the organic material on the front surface of the substrate W is reduced by the recess process after the organic material having a film thickness of 100 angstrom is deposited on the front surface of the substrate W.

In FIG. 13, a film thickness of 10 angstrom or less is considered as including many measurement errors. Therefore, in the present embodiment, when the film thickness of the organic material on the back surface of the substrate W is 10 angstrom or less, it is regarded that the organic material on the back surface of the substrate W has been almost removed.

Referring to FIG. 13, as the recess ratio on the front surface of the substrate W increases, the film thickness of the organic material on the back surface of the substrate W decreases. When the recess ratio on the front surface of the substrate W is 50% or more, the film thickness of the organic material on the back surface of the substrate W is 10 angstrom or less. Thus, it can be considered that the organic material on the back surface of the substrate W has been almost removed. This also applies to the film of the organic material adhering to the edge portion of the substrate W. Therefore, in order to remove the organic material on the edge portion and the back surface of the substrate W, it is desirable to perform the recess process until the recess ratio on the front surface of the substrate W becomes 50% or more.

[Uniformity in Film Thickness of Organic Material]

FIG. 14 is a diagram showing an example of uniformity in film thickness of the organic material on the front surface of the substrate W after the recess process. When the substrate W and the stage 307 are in contact with each other (On stage), if the recess ratio is 29%, the uniformity in film thickness of the organic material on the front surface of the substrate W is 7.9%. Further, when the substrate W and the stage 307 are in contact with each other, if the recess ratio is 60%, the uniformity in film thickness of the organic material on the front surface of the substrate W is 5.9%.

On the other hand, when the distance between the substrate W and the stage 307 is 2.1 mm (Pin up=2.1 mm), if the recess ratio is 27%, the uniformity in film thickness of the organic material on the front surface of the substrate W is 2.8%. When the distance between the substrate W and the stage 307 is 2.1 mm, if the recess ratio is 69%, the uniformity in film thickness of the organic material on the front surface of the substrate W is 1.4%.

It is considered that by performing the recess process in the state in which the substrate W and the stage 307 spaced apart from each other, heat from the heater 307a provided in the stage 307 is transferred to the substrate W in a state in which a temperature distribution according to a shape of the heater 307a is relaxed. By performing the recess process in the state in which the substrate W is spaced apart from the stage 307, the uniformity in film thickness of the organic material on the front surface of the substrate W can be improved as compared with the case where the substrate W and the stage 307 are in contact with each other.

In the present embodiment, the substrate W is held at a position spaced apart from the stage 307 by the lift pins 310. Therefore, when the distance between the substrate W and the stage 307 becomes too long, a difference between an amount of heat transferred from the surface of the stage 307 to the substrate W and an amount of heat transferred to the substrate W via the lift pins 310 becomes large. As a result, the temperature of the substrate W at the position of the lift pins 310 becomes higher than that at other portions, and the temperature distribution of the substrate W becomes more biased. When the bias of the temperature distribution becomes large in the recess process, a distribution of an amount of decrease in the film thickness of the organic material is also more biased, and the uniformity in film thickness of the organic material after the recess process decreases. Therefore, it is desirable that the distance between the substrate W and the stage 307 is not too long. The distance between the substrate W and the stage 307 is desirably in a range of, for example, 0.5 mm or more and 2.1 mm or less.

The embodiment has been described above. As described above, the substrate processing method according to the present embodiment includes the heating process, the depositing process, and the removing process. In the heating process, the substrate W, which is placed on the stage 207 disposed in the container 201 and has a recess formed on one surface thereof, is heated to the first temperature. In the depositing process, by supplying the material gas into the container 201, the thermally decomposable organic material is deposited on the surface of the substrate W. In the removing process, the substrate W is held at the position spaced apart from the stage 307, and the substrate W is heated to the second temperature higher than the first temperature, thereby removing the organic material deposited on the periphery of the recess and the back surface of the substrate W. As a result, it is possible to efficiently remove the organic material adhering to the back surface of the substrate W.

Further, according to the above-described embodiment, in the removing process, the substrate W is heated to the second temperature by the heater 307a provided on the stage 307. As a result, the back surface of the substrate W is efficiently heated, and the organic material on the back surface of the substrate W can be efficiently removed.

Further, in the above-described embodiment, the distance between the substrate W and the stage 307 in the removing process is 0.5 mm or more. As a result, the organic material adhering to the back surface of the substrate W can be efficiently removed.

Further, in the above-described embodiment, the distance between the substrate W and the stage 307 in the removing process is within the range of 0.5 mm or more and 2.1 mm or less. As a result, the organic material adhering to the back surface of the substrate W can be efficiently removed, and the uniformity in film thickness of the organic material deposited on the front surface of the substrate W can be improved.

Further, the substrate processing system 10 according to the above-described embodiment includes the film forming apparatus 200, the recess apparatus 300, the transfer device 106, and the control device 100. The film forming apparatus 200 includes the container 201, the shower head 206, the stage 207, and the heater 207a. The substrate W having a recess formed on one surface thereof is placed on the stage 207. The container 201 accommodates stage 207. The shower head 206 supplies the material gas into the container 201. The heater 207a adjusts the temperature of the substrate W. The recess apparatus 300 includes the container 301, the stage 307, the heater 307a, and the lift pins 310. The substrate W is mounted on the stage 307. The container 301 accommodates the stage 307. The heater 307a adjusts the temperature of the substrate W. The lift pins 310 hold the substrate W at the position spaced apart from the stage 307. The control device 100 controls the heater 207a to execute the heating process of heating the substrate W mounted on the stage 207 to the first temperature. Further, the control device 100 controls the shower head 206 to execute the depositing process of depositing the thermally decomposable organic material on the front surface of the substrate W by supplying the material gas into the container 201. Further, the control device 100 controls the transfer device 106 so as to execute the transfer process of transferring the substrate W, on which the organic material is deposited, from the inside of the container 201 to the inside of the container 301. Further, the control device 100 controls the lift pins 310 to hold the substrate W at the position spaced apart from the stage 307. Further, the control device 100 controls the heater 307a to perform the removing process of removing the organic material deposited on the periphery of the recess and the back surface of the substrate W by heating the substrate W located at the position spaced apart from the stage 307 to the second temperature higher than the first temperature. As a result, it is possible to efficiently remove the organic material adhering to the back surface of the substrate W.

[Others]

The technique disclosed herein is not limited to the above-described embodiment, and many modifications may be made within the scope of the gist thereof.

Figure 15:
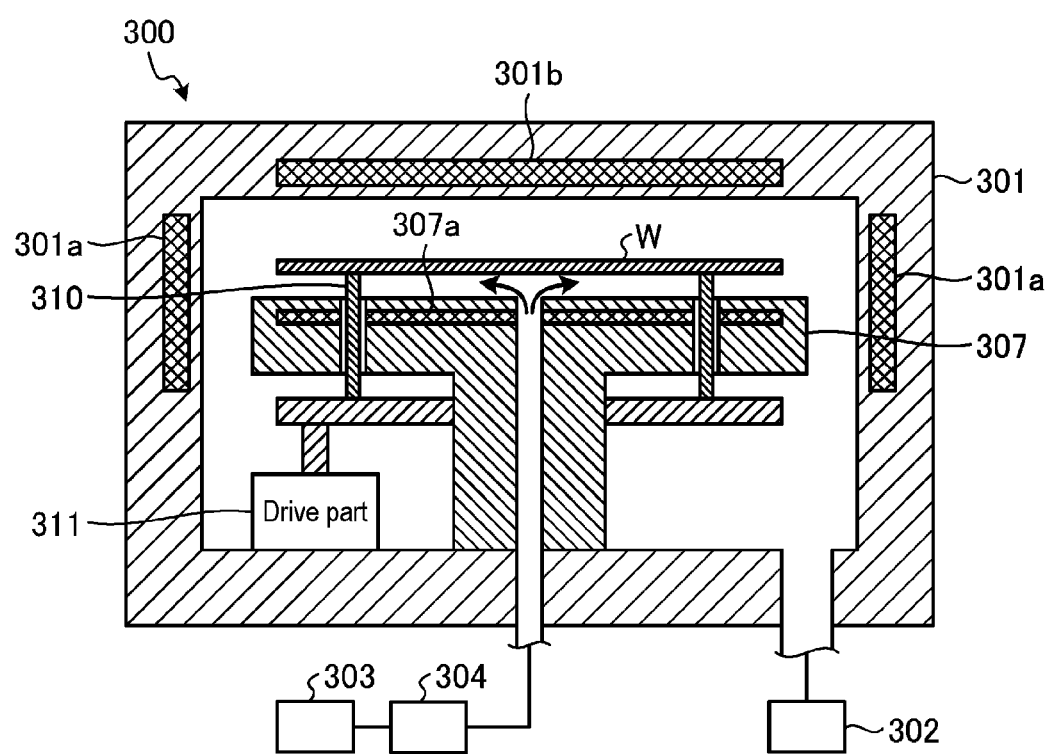
FIG. 15 is a schematic diagram showing another example of the recess apparatus.

For example, in the recess apparatus 300 according to the above-described embodiment, the inert gas is supplied into the container 301 by the shower head 306. However, the disclosed technique is not limited thereto. As another form, for example, as shown in FIG. 15, the inert gas may be supplied to a gap between the substrate W and the stage 307. Further, for example, as shown in FIG. 15, it is desirable that the inert gas is supplied to a gap between the substrate W and the stage 307 so as to flow radially from the center of the back surface of the substrate W toward the edge of the substrate W. In the example of FIG. 15, the heater 301b is provided at a ceiling portion of the container 301. By supplying the inert gas to the gap between the substrate W and the stage 307, the monomers depolymerized and desorbed from the film of the organic material on the back surface of the substrate W are easily movable from the space between the substrate W and the stage 307. As a result, the organic material is less likely to re-adhere to the back surface of the substrate W, and the organic material adhering to the back surface of the substrate W can be removed more efficiently.

Figure 16:
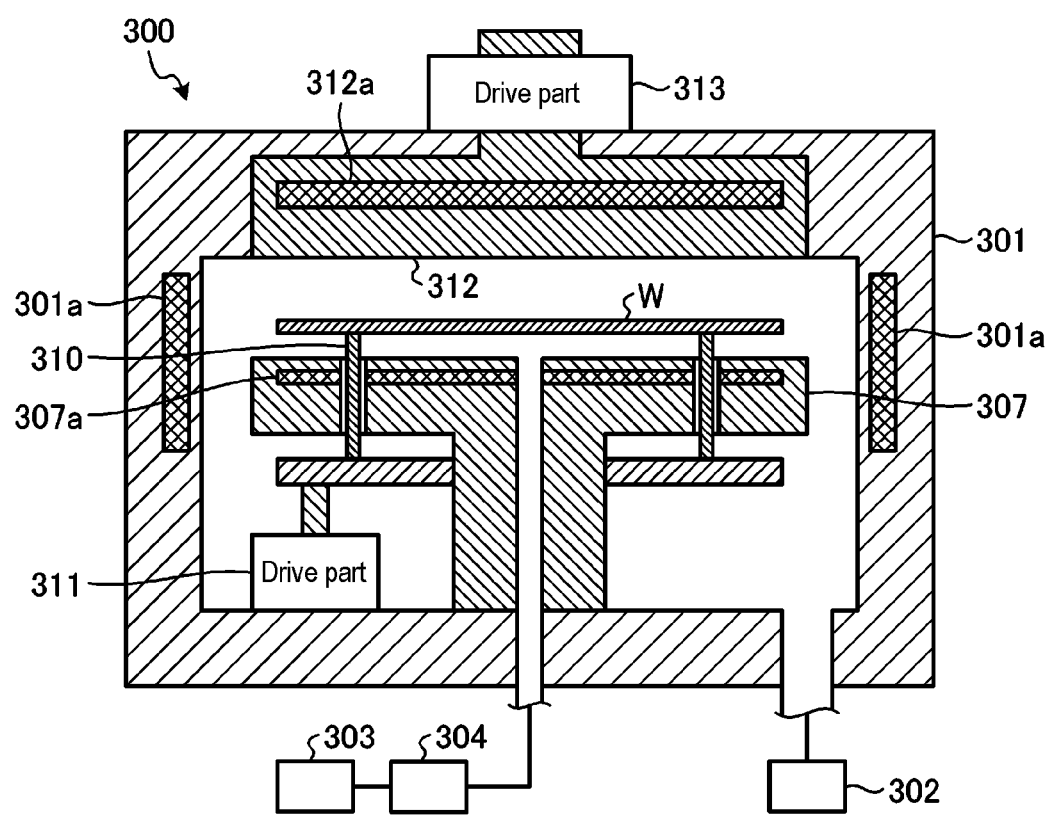
FIG. 16 is a schematic diagram showing another example of the recess apparatus.

Further, as yet another form, a movable ceiling member 312 may be provided at the upper portion of the container 301, for example, as shown in FIG. 16. The ceiling member 312 can be moved in the vertical direction by a drive part 313. A heater 312a is provided in the ceiling member 312. At the time of loading and unloading the substrate W, for example, as shown in FIG. 16, the ceiling member 312 is retracted upward.

Figure 17:
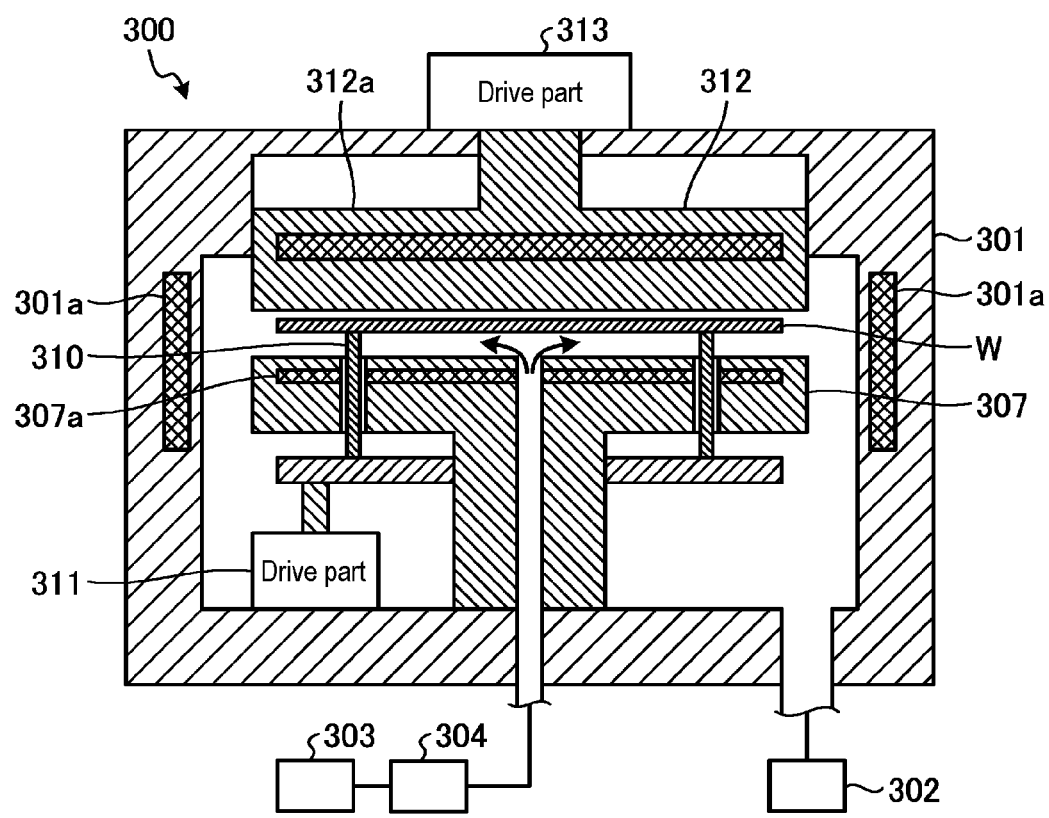
FIG. 17 is a schematic diagram showing another example of the recess apparatus.

In addition, after the substrate W is loaded into the container 301 and is held by the lift pins 310 so that the distance between the substrate W and the stage 307 becomes a predetermined distance, for example, as shown in FIG. 17, the ceiling member 312 is moved downward by the drive part 313. Thus, a space between the ceiling member 312 and the substrate W is narrowed, and a conductance of the space above the substrate W is reduced. As a result, during the recess process, a decrease in the film thickness of the organic material is suppressed on a surface of the substrate W on a side of the ceiling member 312. Further, in the example of FIG. 17, an inert gas is supplied to a gap between the substrate W and the stage 307. As a result, the organic material on the back surface of the substrate W can be removed more efficiently while leaving the organic material on the surface of the substrate W on the side of the ceiling member 312.

Further, in the above-described embodiment, the stage 307 is provided in the recess apparatus 300. However, the disclosed technique is not limited thereto. For example, as long as the heater 307a is provided below the substrate W, the stage 307 may not be provided in the recess apparatus 300.

Further, in the recess apparatus 300 according to the above-described embodiment, the substrate W is held by the lift pins 310 during the recess process. However, the disclosed technique is not limited thereto. As long as a gap of 0.5 mm or more can be formed between the substrate W and the stage 307 during the recess process, the gap of 0.5 mm or more may be formed between the substrate W and the stage 307 by protrusions such as embossing or the like formed on the upper surface of the stage 307.

Further, in the above-described embodiment, the film formation of the organic material is performed by the film forming apparatus 200, and the recess process is performed by the recess apparatus 300. However, the disclosed technique is not limited thereto. As another form, the film formation of the organic material and the recess process may be performed by the same apparatus. For example, the film formation of the organic material and the recess process may be performed by the film forming apparatus 200.

Further, in the above-described embodiment, the polymer having a urea bond is used as an example of the polymer constituting the thermally decomposable organic material. Alternatively, a polymer having a bond other than a urea bond may be used as the polymer constituting the thermally decomposable organic material. Examples of the polymer having a bond other than a urea bond may include polyurethane having a urethane bond. Polyurethane can be synthesized, for example, by copolymerizing a monomer having an alcohol group and a monomer having an isocyanate group. Further, polyurethane is depolymerized into a monomer having an alcohol group and a monomer having an isocyanate group by being heated to a predetermined temperature.

It should be noted that the embodiments disclosed herein are exemplary in all respects and are not limitative. Indeed, the above-described embodiments can be embodied in a variety of forms. Moreover, the above-described embodiments may be omitted, replaced, or changed in various forms without departing from the scope of the appended claims and the gist thereof.

According to various aspects and embodiments of the present disclosure, it is possible to efficiently remove the organic material adhering to the back surface of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
   a heating process of heating a substrate, which is placed on a stage disposed in a container and has a recess formed on one surface of the substrate, to a first temperature;
   a depositing process of depositing a thermally decomposable organic material on a front surface of the substrate by supplying a material gas into the container; and
   a removing process of removing the organic material deposited on a periphery of the recess and a back surface of the substrate, which is opposite to the one surface of the substrate, by holding the substrate at a position spaced apart from the stage and heating the substrate to a second temperature higher than the first temperature.

2. The substrate processing method of claim 1, wherein the removing process includes heating the substrate to the second temperature by a temperature adjuster provided on the stage.

3. The substrate processing method of claim 2, wherein a distance between the substrate and the stage in the removing process is 0.5 mm or more.

4. The substrate processing method of claim 3, wherein the removing process includes supplying an inert gas to a gap between the substrate and the stage.

5. The substrate processing method of claim 2, wherein a distance between the substrate and the stage in the removing process is within a range of 0.5 mm or more and 2.1 mm or less.

6. The substrate processing method of claim 5, wherein the removing process includes supplying an inert gas to a gap between the substrate and the stage.

7. The substrate processing method of claim 1, wherein a distance between the substrate and the stage in the removing process is 0.5 mm or more.

8. The substrate processing method of claim 1, wherein a distance between the substrate and the stage in the removing process is within a range of 0.5 mm or more and 2.1 mm or less.

9. The substrate processing method of claim 1, wherein the removing process includes supplying an inert gas to a gap between the substrate and the stage.

* * * * *